United States Patent
Chang

(10) Patent No.: US 10,262,580 B2
(45) Date of Patent: Apr. 16, 2019

(54) FLEXIBLE DISPLAY DEVICE WITH GATE-IN-PANEL CIRCUIT

(71) Applicant: LG Display Co., Ltd., Seoul (KR)

(72) Inventor: Sung Wook Chang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 78 days.

(21) Appl. No.: 15/515,259

(22) PCT Filed: Dec. 9, 2015

(86) PCT No.: PCT/KR2015/013434
§ 371 (c)(1),
(2) Date: Mar. 29, 2017

(87) PCT Pub. No.: WO2016/108462
PCT Pub. Date: Jul. 7, 2016

(65) Prior Publication Data
US 2017/0221411 A1 Aug. 3, 2017

(30) Foreign Application Priority Data
Dec. 31, 2014 (KR) .......................... 10-2014-0195898

(51) Int. Cl.
*G09G 3/32* (2016.01)
*G09G 3/20* (2006.01)
(Continued)

(52) U.S. Cl.
CPC ................. *G09G 3/32* (2013.01); *G09G 3/20* (2013.01); *G09G 3/36* (2013.01); *G11C 19/287* (2013.01);
(Continued)

(58) Field of Classification Search
CPC ............ G09G 3/32; G09G 3/36; G11C 19/287
See application file for complete search history.

(56) References Cited

U.S. PATENT DOCUMENTS

2006/0267912 A1 11/2006 Lee et al.
2010/0007635 A1* 1/2010 Kwon .................. G09G 3/3677
345/204
(Continued)

FOREIGN PATENT DOCUMENTS

KR 10-2009-0072784 A 7/2009
KR 10-2010-0006063 A 1/2010
(Continued)

OTHER PUBLICATIONS

International Search Report dated Mar. 21, 2016, for corresponding International Application No. PCT/KR2015/013434.
(Continued)

*Primary Examiner* — Alexander Eisen
*Assistant Examiner* — Mansour Said
(74) *Attorney, Agent, or Firm* — Morgan, Lewis & Bockius LLP

(57) ABSTRACT

Provided are a display panel including a scan driver and a method of operating the same. The display panel includes a shift register including a plurality of stages that shifts and outputs a clock signal. A display area in the display panel is divided into a plurality of driving areas. The stages of the shift register corresponding to each driving area form a stage group. In each stage group, the stages included in the stage group sequentially output a scan signal by using an independent start signal.

11 Claims, 7 Drawing Sheets

(51) Int. Cl.
*G11C 19/28* (2006.01)
*G09G 3/36* (2006.01)

(52) U.S. Cl.
CPC ............... *G09G 2300/0426* (2013.01); *G09G 2310/021* (2013.01); *G09G 2310/0218* (2013.01); *G09G 2310/0267* (2013.01); *G09G 2310/0281* (2013.01); *G09G 2310/0286* (2013.01); *G09G 2310/0289* (2013.01); *G09G 2330/021* (2013.01)

(56) References Cited

U.S. PATENT DOCUMENTS

| | | | |
|---|---|---|---|
| 2010/0201666 A1 | 8/2010 | Tobita | |
| 2012/0075280 A1* | 3/2012 | Liu | G09G 3/3677 345/212 |
| 2012/0162187 A1* | 6/2012 | Lee | G09G 3/007 345/212 |
| 2013/0241814 A1 | 9/2013 | Hirabayashi et al. | |
| 2014/0022228 A1* | 1/2014 | Bae | H03K 17/16 345/212 |
| 2017/0124976 A1* | 5/2017 | Chen | G09G 3/3677 |

FOREIGN PATENT DOCUMENTS

| | | |
|---|---|---|
| KR | 10-2012-0056005 A | 6/2012 |
| KR | 10-2014-0079106 A | 6/2014 |
| KR | 10-2014-0096613 A | 8/2014 |
| KR | 10-2014-0131448 A | 11/2014 |

OTHER PUBLICATIONS

Extended European Search Report dated May 25, 2018 issued in corresponding European Patent Application No. 15875556.1.
EP Communication in counterpart EP Application No. 15875556.1.

* cited by examiner

[Fig. 1]
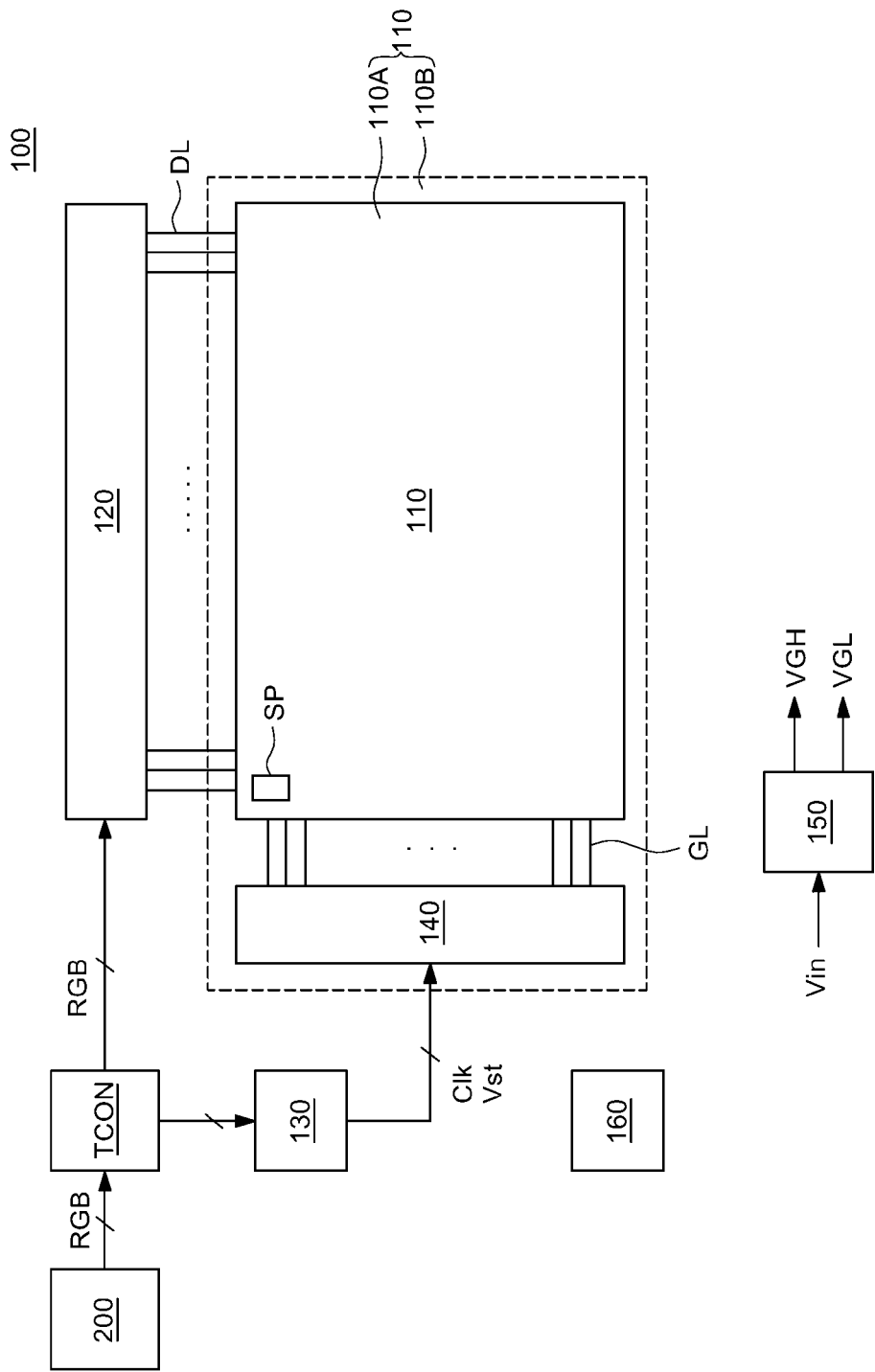

[Fig. 2]
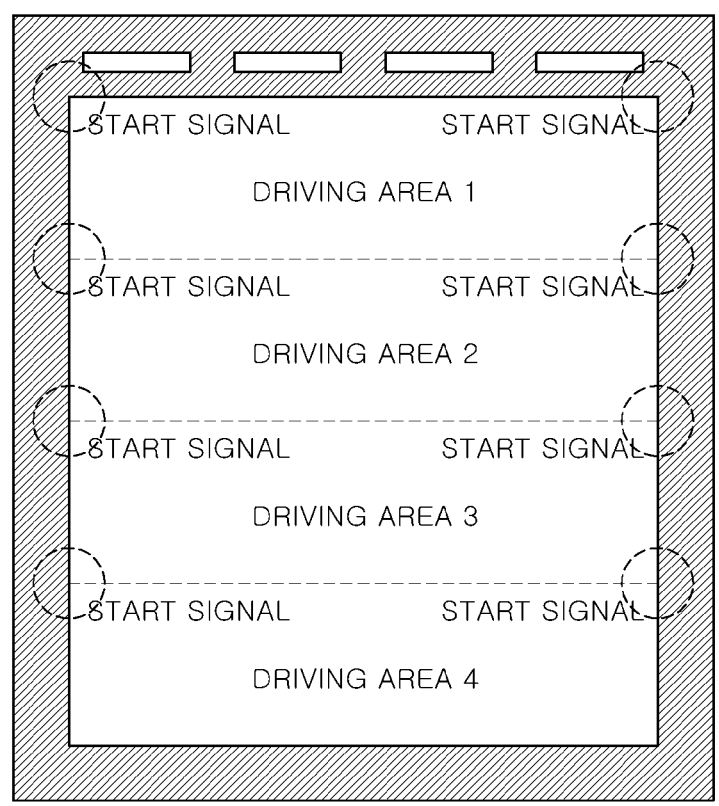

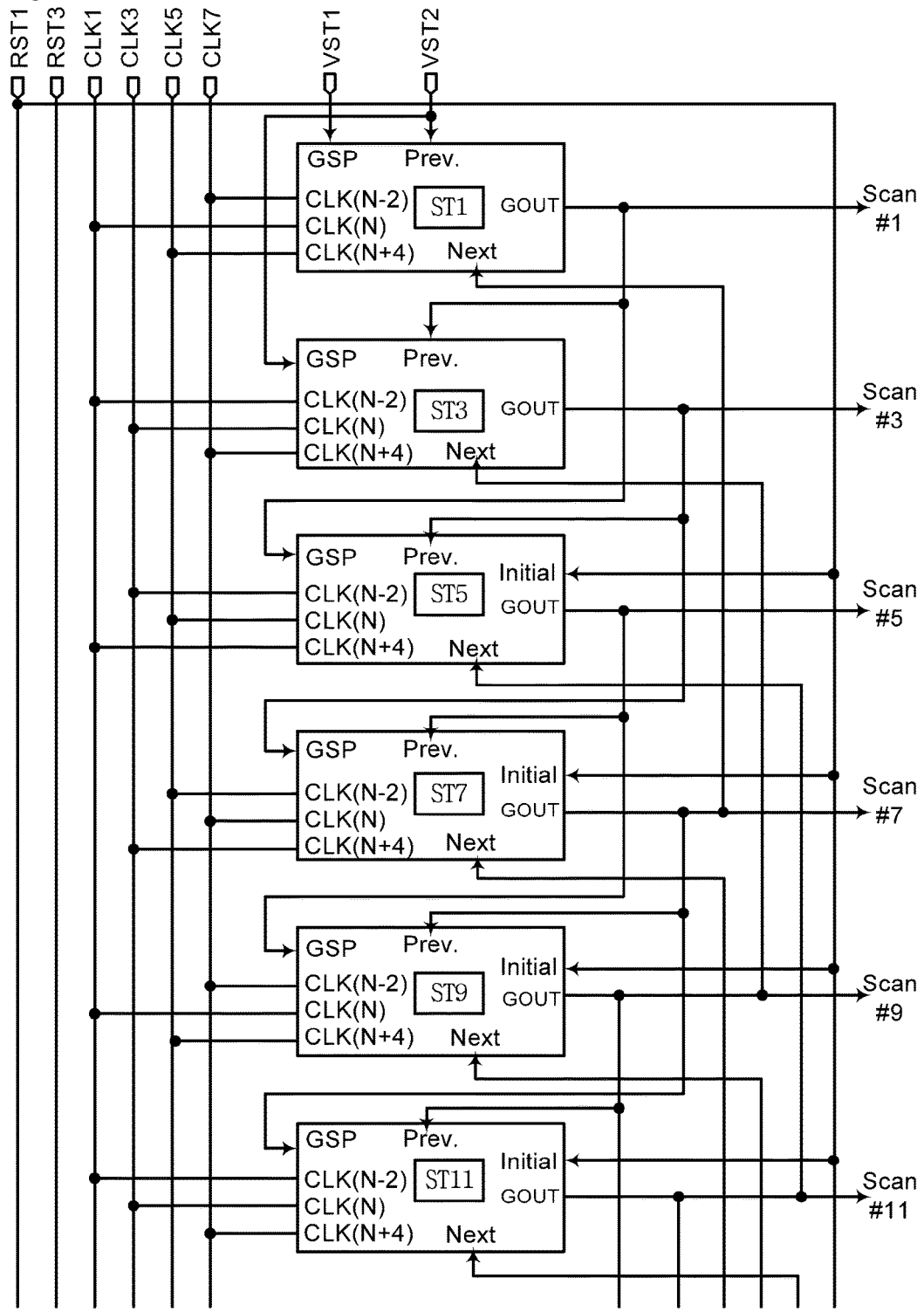
[Fig. 3]

[Fig. 4]
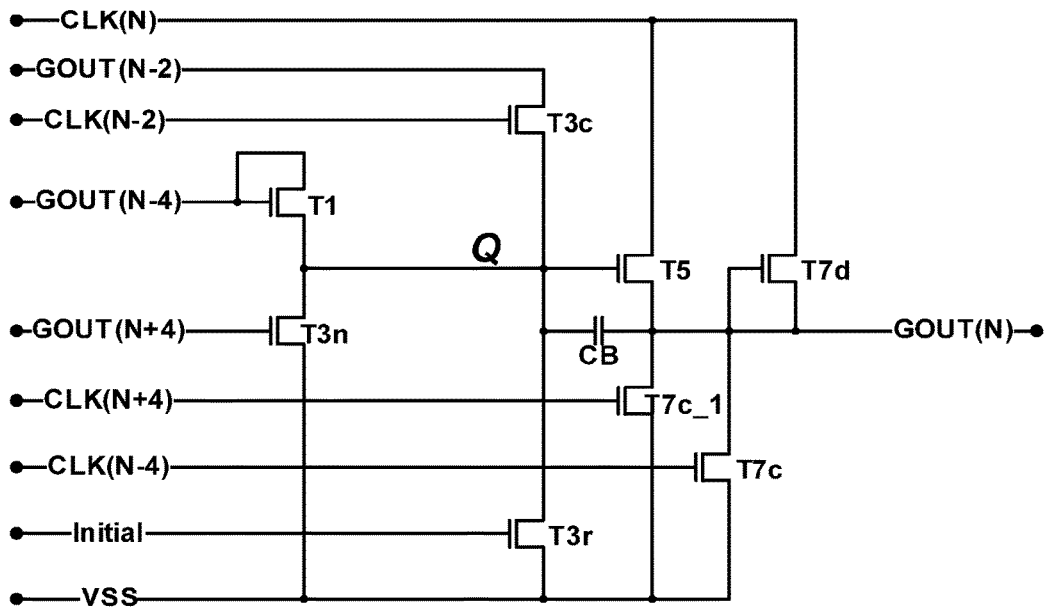

[Fig. 5A]
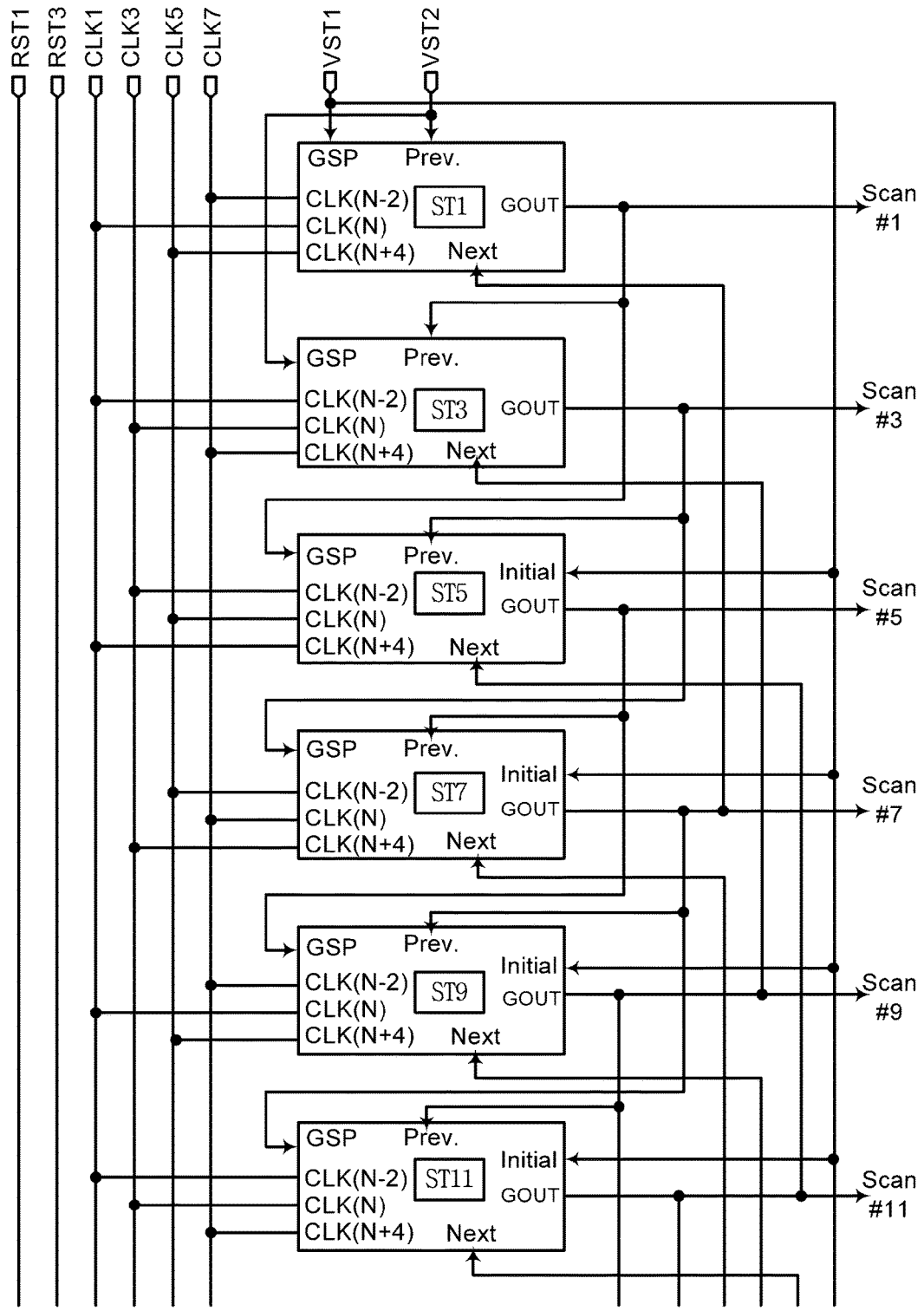

[Fig. 5B]
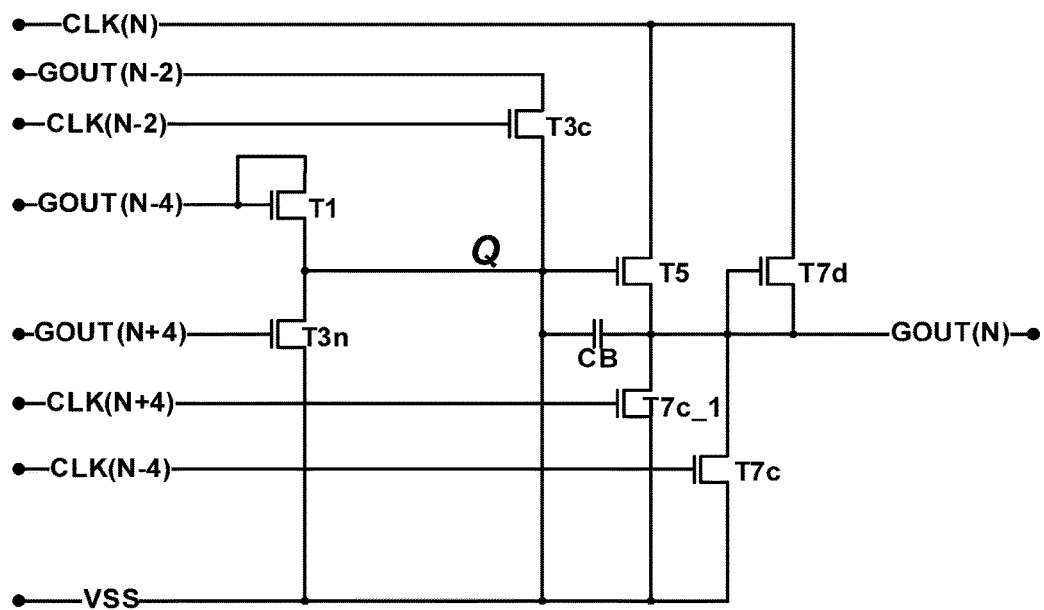

[Fig. 6]
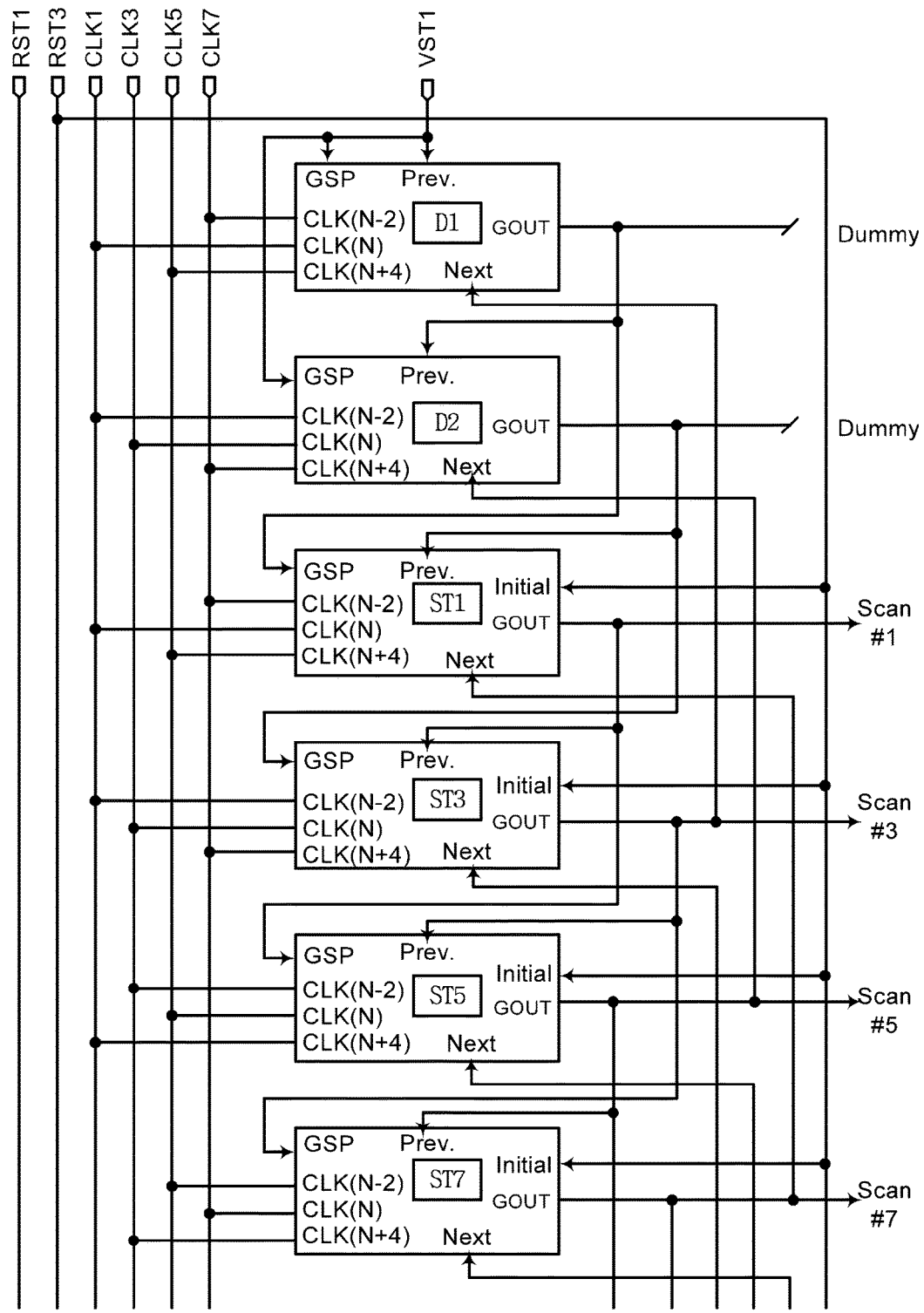

FLEXIBLE DISPLAY DEVICE WITH GATE-IN-PANEL CIRCUIT

TECHNICAL FIELD

The present disclosure relates to a display device. More particularly, the present disclosure relates to a display device including a scan driver capable of reducing power consumption and a method of operating the same.

BACKGROUND ART

As information technology develops, a display device which connects a user with information has become more important. Examples of the display device may include flat panel displays such as an organic light emitting display device and a liquid crystal display device.

A display device includes a display panel that comprises a plurality of pixels disposed in a matrix pattern and a driving unit for driving the pixels. The pixels may be divided into red, green, and blue sub-pixels in order to realize colors. A white sub-pixel may be added if necessary. Each of the sub pixels is connected to one of a plurality of scan lines and one of a plurality of data lines provided in the display panel. The driving unit includes a scan driver for supplying a scan signal to the scan lines disposed in a display area and a data driver for supplying a data signal to the data lines. Upon receiving the scan signal via the scan line, the sub-pixels are charged with the data signal supplied from the data line, and emit lights according to the data signal to display an image.

The scan drive can be configured with a plurality of integrated circuit (IC) chip mounted in the non-display area of the display panel. However, IC chip makes it difficult to reduce the bezel size of the display device. Accordingly, use of the IC chip as the scan driver is to be avoided, and instead, the scan driver should be provided in a Gate-In-Panel (GIP) structure implemented with thin-film-transistors disposed in the non-display area on the display panel. The scan driver includes a shift register 140. The shift register 140 includes a plurality of stages that are arranged to shift a scan signal in reference to a predetermined clock signal and output scan signals on the scan lines. For each frame of image data to be displayed on the display area, the scan driver outputs a scan signal sequentially from the first scan line to the last scan line of the display panel.

Recently, as the application fields of the display device have expanded, the display device displays various kinds of images. Many features that were once provided in a physical form are now provided as an interactive graphical interface displayed on the screen of the device. For example, physical buttons of many electronic devices are being replaced by graphical buttons, which a user can interact via touch screens.

Type of contents to be displayed by the display device have also been advanced, and many different types of image contents are simultaneously presented on the screen. For instance, a video may be displayed in a part of a screen while another part of the screen displays a still image (ex. a text or a picture). Accordingly, it would be desirable if the refresh rate of pixels in a selective region of the screen can be adjusted differently from other regions of the screen. Similarly, it would be desirable to temporarily pause and resume driving of a selective region of the screen without interrupting the driving of other regions of the screen. In other words, only some of stages corresponding to a specific area of a screen may be partially driven, or stages corresponding to a certain area may be differently driven from stages corresponding to another area. In this way, power consumption can be reduced or a noise caused by output of scan signals can be reduced to improve performance of the display device in many ways. However, a typical scan driver is configured to output a scan signal sequentially from the first stage to the last stage, each corresponding to the first scan line to the last scan line of the display area. Thus, it is difficult to control a selective regions of the screen differently from other regions of the screen.

SUMMARY

According to an aspect of the present disclosure, there is provided a display device including: a display panel including a display area divided into a plurality of driving areas. A non-display area of the display panel includes a scan driver. The scan driver includes a level shifter configured to output a plurality of start signals and a shift register including a plurality of stage groups. Each stage group of the shift register corresponds to one of the driving areas. Each stage group includes at least one stage configured to receive a start signal via at least one external start signal line.

In one embodiment, the uppermost stage of each stage group may be configured to receive at least two start signals via at least two external start signal lines dedicated for the respective stage group.

In each of the stage groups, stages excluding the first two stages of the stage group may include a transistor configured to clear noise on a Q-node of the stage by discharging the Q-node of the stage to a low potential voltage upon receiving an initial signal. The initial signal may be one of the two start signals supplied via the external start signal lines.

In one embodiment, the first two stages in each of the stage groups corresponding to each of the respective driving areas may be configured as dummy stages which do not output scan signals. Herein, the first two stages in the each of the stage groups, each corresponding to one of the driving areas, is supplied with the start signal via said at least one external start signal line. Further, the dummy stages of the stage group may have a different circuit configuration from the remainder of the stages in the same stage group. Moreover, in each of the stage groups, the stages excluding the dummy stages may be configured to have the same circuit structure as each other.

The stages excluding the dummy stages in each of the stage groups may include a transistor configured to clear a Q-node of the stage by discharging the Q-node to a low potential voltage upon receiving an initial signal, which may be supplied via said at least one external start signal line.

Another aspect of the present disclosure relates to a method of operating a display device. The method includes: driving a set of stages of a first stage group corresponding to a first driving area of a display panel by supplying a start signal via an external start signal line connected to a first stage of the first stage group; supplying a reset signal to a lowermost stage of the first stage group; and driving a set of stages of a second stage group corresponding to a second driving area of the display panel by supplying a start signal via an external start signal line independently connected to a first stage of the second stage group.

The present disclosure employs various operation methods. The methods include a method of dividing a display device into a plurality of driving areas and allowing only some stages corresponding to some driving areas to be driven. The methods further include a method of temporarily stopping output of scan signals and then restarting the output of the scan signals. Accordingly, it is possible to reduce power consumption of the display device, improve touch scan sensitivity, or output an image in a part in a different manner.

According to some embodiments described in the present specification, some region of the display area can be selectively driven or not-driven depending on an image displayed on the display device. A selective regions of the display device can be driven at a different refresh rate from the other areas. Therefore, it is possible to display various types of image contents on a screen while minimizing unnecessary refreshing on selective regions of the screen. Further, a typical 2D image may be displayed in part of a screen and a stereoscopic (3D) image may be displayed in another part of the screen. Furthermore, an image may be displayed so as to be suitable for various viewing angles.

Further, according to some embodiments described in the present specification, a partial region of the display panel can be driven at a different refresh rate from the other regions of the display panel. Therefore, it is possible to reduce power consumption of the display device.

Furthermore, according to some embodiments, during a period in which output of scan signals is paused between driving of different driving areas of the display area, touch scan operation is performed to recognize touch inputs on the display panel. In this way, it is possible to perform a touch scan operation on the entire display area multiple times during displaying one frame of image data. In one embodiment, the method includes outputting scan signals from stages in a first stage group corresponding to a first driving area of a display area; performing touch scan operation on the entire display area; and outputting scan signals from stages of a second stage group corresponding to a second driving area of the display area. Therefore, it is possible to improve touch sensitivity of the display device.

BRIEF DESCRIPTION OF DRAWINGS

The above and other aspects, features and other advantages of the present disclosure will be more clearly understood from the following detailed description taken in conjunction with the accompanying drawings, in which:

FIG. 1 is a block diagram illustrating an exemplary display device according to an embodiment of the present disclosure.

FIG. 2 is a schematic illustration of a display area provided with four driving areas for describing a method of operating a display device according to various embodiments of the present disclosure.

FIG. 3 is illustrates an exemplary configuration of a shift register provided in a display device according to an embodiment of the present disclosure.

FIG. 4 is a circuit diagram illustrating exemplary configuration of a stage in a shift register according to an embodiment of the present disclosure.

FIG. 5A is illustrates an exemplary configuration of a shift register provided in a display device according to an embodiment of the present disclosure.

FIG. 5B is a circuit diagram illustrating an example of a circuit structure for the first and second stages of each of the stage groups in the shift register, which is different from the configuration of other stages in the same stage group.

FIG. 6 is a diagram illustrating an exemplary configuration of a shift register provided with dummy stages in each of the stage groups corresponding to the driving areas according to an embodiment of the present disclosure.

DETAILED DESCRIPTION OF THE PREFERRED EMBODIMENT

In the following, exemplary embodiments of the present disclosure will be described in detail with reference to the accompanying drawings. In the following description, TFTs constituting a shift register of the present disclosure may be preferably realized as oxide TFTs (for example: Indium Gallium Zinc Oxide: IGZO). However, the technical concept of the present disclosure is not limited thereto, and can be applied to a-Si:H TFT and a poly TFT for an LTPS process.

FIG. 1 is a schematic block diagram of a display device 100. As illustrated in FIG. 1, a display device 100 includes a display panel 110, display device driving units, a power supply unit 150, and the like. The display panel 110 may be divided into a display area 110A and a non-display area 110NA. The display area 110A includes sub-pixels SP for displaying images. Various signal lines, driving units and pads for connecting various components to the display panel 110 are placed in the non-display area 110B. The sub-pixels SP are operated in response to the signals applied on the data lines DL and the scan lines GL. The sub-pixel SP includes a switching transistor SW connected to a first scan line GL1 and a first data line DL1. The sub-pixel SP further includes a pixel circuit PC, which is driven in response to the data signal supplied via the switching transistor SW. Detailed configuration of the pixel circuit PC can vary between the sub-pixel SP of a liquid crystal display device and the sub-pixel SP of an organic light emitting display device.

In the present disclosure, the display panel 110 the uses the active matrix addressing scheme to operate the array of sub-pixels SPs. For example, the display panel 110 may be a liquid crystal display (LCD) panel, an organic light emitting diode (OLED) display panel and an electrophoretic display (EPD) panel. In case of a LCD panel, the display panel 110 can be implemented in various modes, such as a TN (Twisted Nematic) mode, a VA (Vertical Alignment) mode, an IPS (In Plane Switching) mode, an FFS (Fringe Field Switching) mode and an ECB (Electrically Controlled Bire-fringence) mode, for regulating the angle of the liquid crystal molecules to control the light emission from the display panel 110. In case of an OLED display panel, the OLED elements of the display panel 110 may be a top-emission type, a bottom-emission type, or a dual-emission (i.e., top & bottom) type.

The display device driving unit may include a timing controller TCON, a data driver 120, a level shifter 130, a scan driver 140, and the like. The timing controller TCON is configured to receive timing signals, such as a vertical sync signal, a horizontal sync signal, a data enable signal, and a dot clock, from the host system 200.

The timing controller TCON generates a data control signal DCS and a gate control signal GCS for controlling operation timing of the data driver 120 and the scan driver 140 in response to an input timing signal. Gate control signals GCS may include a gate start signal (GSP), a gate start signal (VST), a gate shift clock (GSC), a gate output enable signal (GOE), a gate start signal (VST), a gate clock (GCLK), and the like.

The host system 200 may be a part of electronic devices including a TV (Television), a set-top box, a navigation system, a computer system, a portable device such as a cell phone or a tablet PC, or a wearable device such as a watch, glasses, and the like. In addition, any device or modules included in the device configured to apply a signal for controlling the timing controller TCON are collectively called "host system 200". The host system 200 transmits pixel data corresponding to an input image received from various video sources to the timing controller TCON. Further, the host system 200 transmits a timing signal synchronized with the pixel data to the timing controller TCON. Furthermore, the host system 200 rectifies power from an external power supply or battery and then generates an input voltage Vin and supplies the input voltage Vin to the power supply unit 150.

The data driver 120 is supplied with video data RGB and a data control signal DCS from the timing controller TCON. The data driver 120 supplied with the video data RGB converts the video data RGB into a gamma compensation voltage in response to the data control signal DCS so as to generate a data signal. Then, the data driver 120 supplies the data signal on the data lines DL. In order to do so, the data driver 120 may include one or more source drive integrated circuits (ICs). The source drive IC is connected to the data lines DL by a COG (Chip-On-Glass) process or a TAB (Tape Automated Bonding) process.

The scan driver includes a level shifter 130 and a shift register 140. The level shifter 130 shifts voltage levels of various gate control signals GCS including clock signals CLK and one or more start signals VST supplied from the timing controller TCON and supplies the gate control signals GCS to the shift register 140.

The level shifter 130 shifts levels of clock signals CLK, reset clock signals RST, and a start signal VST under the control of the timing controller TCON, and then supplies the signals to the shift register 140. The shift register 140 may be implemented with thin-film-transistor TFT formed in the non-display area 110B of the display panel 110. The scan driver having such a shift register may be referred to as the Gate-In-Panel (GIP) type scan driver. The shift register 140 includes stages configured to sequentially output a scan signal in response to the clock signals CLK, the reset clock signals RST, and the start signal VST.

The TFTs used in the sub-pixels (i.e., pixel circuit) and the shift register 140 may be formed on the same substrate of the display panel 110. An oxide metal semiconductor TFT (oxide TFT) has a higher current mobility than an amorphous silicon (a-Si) TFT, and, thus, a circuit can be designed to have a small size. Further, the oxide TFT has a lower leakage current than the a-Si TFT and a Low Temperature Poly-Silicon (LTPS) TFT. Accordingly, the pixel circuits and the scan driver implemented with oxide TFTs may make it easy to drive the display panel 110 or a selective portion of the display panel 110 at a reduced refresh rate (i.e., low frame rate). As such, in some embodiments, the TFTs implementing the pixel circuits and the driving circuits are the oxide TFTs. However, in some other embodiments, the pixel circuits and the driving circuits described in the present disclosure can be implemented with the a-Si TFT or the LTPS TFT. Further, in some embodiments, any combination of a-Si TFTs, LTPS TFTs and oxide TFTs can be used in implementing the pixel circuits and the driving circuits.

The signal provided to the level shifter 130 may be a Transistor-Transistor Logic (TTL) level signal that swings between a predetermined low voltage VGL and a predetermined high voltage VGH. The level shifter 130 shifts and converts the voltage of the input signal to a voltage between a gate low voltage VGL and a gate high voltage VGH, which is suitable for the shift register 140 and the pixel circuits of the display panel 110. The gate low voltage VGL may be set to a voltage that is lower than a threshold voltage of the transistor, for example −10 V. The gate high voltage VGH may be set to a voltage that is higher than the threshold voltage of the transistor, for example +20 V. The level shifter 130 may be provided in a form of an IC and mounted on the non-display area 110B of the display panel 110 or on an external substrate connected to the display panel 110.

The power supply unit 150 receives the input voltage Vin from the host system 200, and generates a driving voltage required for driving the display driving unit 120, 130, and 140 and the display device 100. The power supply unit 150 generates various driving voltages by regulating the input voltage Vin with a DC-DC converter, a charge pump, a regulator, and the like. The power supply unit 150 may be integrated into a power IC chip. The driving voltage may include a power supply voltage for various drive driving units of a panel, a gamma reference voltage supplied to the data driver 120, the gate high voltage VGH and the gate low voltage VGL. The driving voltage may further include a common voltage Vcom for an LCD panel, and a pixel driving voltage ELVDD/ELVSS for an OLED display panel.

The display panel 110 of the display device 100 may be equipped with a touch recognition system. The touch recognition system can include a plurality of touch sensor lines and a touch sensor 160 (e.g., a touch drive IC) for supplying touch sensing signals on the touch sensor lines to identify touch inputs made on the display panel 110. A touch recognition system provided in the display panel 110 may be a resistive type and a capacitive type. In case of the capacitive type touch recognition system, the touch recognition system in the display panel 110 may be a self-capacitance type or a mutual-capacitance type touch recognition system. Further, based on the configuration of the touch sensor lines in the display panel 110, the touch recognition system can be classified as one of an in-cell type, an on-cell type, a hybrid type and an add-on type. It should be noted that, in some exemplary embodiments, a touch sensing function may be omitted from the display device 100. In such cases, the touch sensor lines and the touch sensor 160 may be omitted.

For convenience of explanation, embodiments of the present disclosure will be explained in reference to a display panel employing an in-cell type capacitance touch recognition system. In the in-cell type touch recognition type, electrodes for touch recognition are integrated into the display panel 110. For instance, the common electrodes in a LCD display panel used for generating electric fields to control the liquid crystal molecules may also serve as touch sensing electrodes of the touch recognition system.

In FIG. 1, the single shift register 140 is provided on one side of the display area 110A. However, it should be appreciated that multiple shift registers may be separately provided on different regions of the display panel 110, for example, one on each side of the display area 110A. In such cases, the shift register 140 may be configured in an interlaced manner. That is, the shift register 140 on one side may include stages that apply scan signals on the odd-numbered scan lines, and the shift register 140 on the other side may include stages that apply scan signals on the even-numbered scan lines.

FIG. 2 is a diagram for describing a method of operating the display device 100 with reference to some embodiments of the present specification.

In some embodiments of the present disclosure, the scan driver provided in the display device 100 may be driven as being divided into N number of areas as illustrated in FIG. 2. For example, image data refresh can be paused or performed at a delayed rate at certain portion of the display area 110A while another portion of the display area 110A is refreshed at a predetermined normal frame rate. In other words, both a driving area and a non-driving area can exist in the display area 110A outputting a frame of image. In the driving area, the scan signal is applied on the scan lines GLs so that the sub-pixels of the driving area are charged with the data signals on the data line DL. In the non-driving area, however, the scan signal is not provided on the scan lines. Thus, the sub-pixels in the non-driving area is not charged with the new data signal. Simply put, the frame rate for each of the driving area can be selectively lowered or increased.

In the embodiments depicted in FIG. 2, the display area 110A is divided into the first to fourth driving areas of the same size. However, the number of driving areas in the display area 110A is not limited as such, and more driving areas or less driving areas may be provided in the display area 110A. Also, it should be noted that the size of the driving areas needs not be the same. Some driving area can be larger than others. Moreover, if desired, a driving area may be driven to apply a scan signal to the corresponding sub-pixels in the driving area, then after a predetermined period of time, a subsequent driving area may be driven. For example, after providing the scan signal on the scan lines of the first driving area, there may be a period of delay before providing the scan signal on the scan lines of the second driving area. In other words, the scan driver may be operated such that stages corresponding to the first driving area output the scan signal, and hold the operation of the stages corresponding to the second driving area for a predetermined time.

As such, in order to separately drive the areas of the panel 110, the shift register 140 of the display panel 110 is configured with a number of stage groups corresponding to the number of driving areas. That is, each of the stage groups corresponds to each of the driving areas. Further, in order to divide and drive a screen into N areas as necessary, an operation of each stage group may be stopped for a predetermined period of time until a start signal is applied again. Then, when the start signal is applied, each stage group may be driven again.

More specifically, each stage group for the driving area includes at least one stage which is configured to receive a start signal VST applied from an individual start line, rather than from a previous stage. In this setting, the separate start signal line can be added as the number of stage groups for the driving areas increase.

FIG. 3 is a diagram illustrating an exemplary configuration of a scan driver for driving a display area 110A with a plurality of driving areas according to an embodiment of the present disclosure.

As illustrated in FIG. 3, a scan driver may have a Simple Logic Circuit (SLC)-based configuration. The shift register 140 includes a plurality of stages (e.g., ST1~ST11). The stages output a scan signal through an output terminal GOUT in response to gate control signals GCS. The stages included in the shift register 140 are disposed so as to be connected in a sequential manner. In response to at least one clock signal, the stages shifts a start signal VST and each stage outputs a scan signal through the output terminal GOUT.

Only the stages ST1 to ST11, which corresponds to odd-numbered scan lines in one of the driving areas, are depicted in FIG. 3. Additional stages of the scan lines in the driving area are omitted in FIG. 3 for convenience of explanation. As mentioned, another shift register 140 can be provided on the other side of the display device, which includes stages ST2 to ST12 configured to output scan signals on even-numbered scan lines of the same driving area. Similar to the stages in the odd-numbered lines, the stages in the even-numbered lines are also applied with the gate control signals GSC.

The first stage ST1 (i.e., the uppermost stage of the stage group) in each driving area clears noise on its Q-node by in response to a start signal (GSP) supplied through the first start signal line VST1. Further, the first stage ST1 charges the Q-node in response to another start signal supplied through the second start signal line VST2. The next stage ST3, which is the immediately subsequent stage of the first stage ST1, uses the start signal from the second start signal line VST2 as the first start signal GSP. Further, the stage ST3 uses the scan signal Vg_Out_1 from the output terminal GOUT of the immediately previous stage ST N−1, that is, the first stage ST1, as the second start signal.

Stages subsequent to the stage ST1 and the stage ST3 do not receive start signals from the external start signal lines such as the first and second start signal lines VST1 and VST2. Instead, they are configured to remove a noise of the Q-node by using a scan signal output from the immediately previous stage ST N−1 and charge the Q-node by using a scan signal output from the stage even prior to the immediately previous stage ST N−2, for instance the scan signal output from the stage ST N−4. Further, each of the stages discharges the Q-node in response to the scan signal (Vg_Out_N+3) output from an output terminal GOUT of its third subsequent stage ST N+3.

The pixels in the subsequent driving area are driven by the subsequent stage group, which also includes a set of sequentially arranged stages as described above. In other words, the subsequent driving area also includes the stages configured to receive start signals from the external start signal lines VST1 and VST2. The stages in the subsequent driving area are not driven until a start signal is applied through a separate start line. The individual driving areas of the screen can be driven separately by providing separate start signal lines, which provide independent start signals to stages of the respective driving area.

When the display area 110A is driven as being divided into a plurality of driving areas as such, a stage may need to be reset in response to scan signals output from its subsequent stages (for example, ST N+2, ST N+3, ST N+4, and the like.). In this case, the stages may be reset by using a reset signal applied from a separate reset signal line. For example, the last stage of each stage group corresponding to a driving area may be configured to be supplied with a signal applied from a separate reset signal line (for example, RST1) instead of an output of its subsequent stage. The reset signal or initial signal may also be supplied from another reset signal line (for example, RST3).

FIG. 4 is a circuit diagram illustrating a configuration of a stage, for instance stage ST5, included in a shift register 140 having an SLC (Simple Logic Circuit) structure according to an exemplary embodiment.

As illustrated in FIG. 4, a stage includes a Q-node charging/discharging circuit and an output circuit. The Q-node charging/discharging circuit comprises a first transistor T1, a second transistor T3n, a third transistor T3c, and a fourth transistor T3r. The output circuit comprises a fifth transistor T5, a sixth transistor T7c, a seventh transistor T7d, an eighth transistor T7c_1, and a capacitor CB.

As for the first transistor T1, the gate electrode and the first electrode (e.g., source or drain) are connected to the output terminal GOUT[N−4] of the stage ST N−2, and the second electrode of the first transistor T1 is connected to the Q-node. The first transistor T1 charges the Q-node in response to the scan signal output from the output terminal GOUT[N−4] of the stage ST N−2.

As for the second transistor T3n, the gate electrode is connected to the output terminal GOUT[N+2] of the stage ST+2, the first electrode is connected to the Q-node, and the second electrode is connected to a low potential voltage terminal VSS. The second transistor T3n discharges the Q-node in response to a scan signal output from the output terminal GOUT[N+2] of the stage N+2.

As for the third transistor T3c, the gate electrode is connected to an N−2 clock signal line CLK[N−2], the first electrode is connected to the output terminal GOUT[N−2] of an stage ST N−1, and the second electrode is connected to the Q-node. The third transistor T3c charges the Q-node in response to an N−2 clock signal supplied from the clock signal line CLK[N−2].

As for the fourth transistor T3r, the gate electrode is connected to a reset signal line, the first electrode is connected to the Q-node, and the second electrode is connected to the low potential voltage terminal VSS. The fourth transistor T3r resets the Q-node to a low potential voltage supplied from the low potential voltage terminal VSS in response to the reset signal supplied from the first reset signal line RST1 or RST3.

As for the fifth transistor T5, the gate electrode is connected to the Q-node, the first electrode is connected to the clock signal line CLK[N], and the second electrode is connected to the output terminal GOUT[N] of its stage. The fifth transistor T5 is turned on and off based on the potential of the Q-node and outputs a clock signal supplied from the clock signal line CLK[N] through the output terminal GOUT[N].

As for the sixth transistor T7c, the gate electrode is connected to the clock signal line CLK[N−4], the first electrode is connected to the output terminal GOUT[N], and the second electrode is connected to the low potential voltage terminal VSS. The sixth transistor T7c provides the low potential voltage supplied from the low potential voltage terminal VSS on the output terminal GOUT[N] based on the clock signal supplied from the clock signal line CLK[N−4].

As for the seventh transistor T7d, the first electrode is connected to an clock signal line CLK[N] and the gate electrode and the second electrode are connected to the output terminal GOUT[N]. The seventh transistor T7d outputs the clock signal supplied from the clock signal line CLK[N] through the output terminal GOUT[N] based on the potential of the output terminal GOUT[N] of its stage.

As for the eighth transistor T7c_1, the gate electrode is connected to an clock signal line CLK[N+2], the first electrode is connected to the output terminal GOUT[N] of its stage, and the second electrode is connected to the low potential voltage terminal VSS. The eighth transistor T7c_1 provides the low potential voltage supplied from the low potential voltage terminal VSS to the output terminal GOUT[N] based on the clock signal supplied from the clock signal line CLK[N+2].

As for the capacitor CB, one of the terminals is connected to the Q-node and the other terminal is connected to the output terminal GOUT[N] of its stage. The capacitor CB is configured to bootstraps the Q-node by using the potential between the Q-node and the output terminal GOUT[N].

The first reset signal supplied through the first reset signal line RST1 may be generated at a logic high level once for each frame. For instance, the first reset signal may be generated at a logic high level once when each frame is ended, but the timing and frequency of the first reset signal provided at the logic high level is not limited as such.

As described above, each stage group for a driving area may be provided with four start signal lines (two for the stages for odd-numbered scan lines and two for the stages for even-numbered scan lines). Accordingly, if the display area 110A is divided into a total of four driving areas as illustrated in FIG. 2, total of sixteen external start signal lines (i.e., eight start signal lines on each side of the display area 110A) may be provided to apply start signals to the driving areas of the display area 110A. In order to normally drive a frame by sequentially driving all of the driving areas of the display device, the start signals for each of the stage groups may be provided in a sequentially synchronized manner. For example, when outputting of the scan signals on the scan lines of a driving area is ended, start signals can be provided to the first stage of the stage group for the subsequent driving area.

If desired, a predetermined amount of delay period may be placed before applying the start signal to the stages of the subsequent driving area. During the delay period, a touch recognition operation can be performed. In this way, touch recognition scanning operation on the display area 110A can be performed multiple times while displaying a single frame of image data on the display area 110A. Further, noise is reduced during the delay period in which a scan signal is not applied to a driving area. As such, it is possible to perform the touch recognition operation with a higher resolution as compared to a conventional method in which a touch scan operation is performed once during a blank time between two different frames.

In addition, only the driving area that outputs continuously changing images may be driven, while the driving area that outputs the same image or that does not need to output an image may not be driven. The sub pixels that output the same image data in the next frame may not need to be refreshed as long as those sub pixels can stably hold the previously charged image data. Accordingly, the driving area, which is continuously supplied with new image data can be refreshed at a certain predetermined frequency (i.e., normal frame rate), while the driving area, which is continuously fed with the same image data, may be refreshed at a certain predetermined frequency slower than the normal frame rate. In this way, waste in power usage of the display device by repeatedly refreshing the sub pixels of the driving area with the same image data can be minimized.

By way of example, if four driving areas are included as illustrated in FIG. 2, the sub pixels in two of the driving areas may be refreshed at the display device's normal frame rate (e.g., 60 FPS, 120 FPS, 240 FPS, etc.) to display video. The two other remaining driving areas may display a still image, and the sub pixels in those driving areas may be refreshed at a reduced frame rate (e.g., 1 FPS, 15 FPS, 30 FPS, etc.). This can be achieve by temporarily stopping the supply of the start signals to the stages of those driving areas to be driven at a reduced frame rate. The stages in such driving areas do not output the scan signal on the scan lines, and thus the sub pixels are not refreshed with a new image data. In other words, some of the driving areas, which need not be driven at unnecessarily fast frame rate, can be selectively driven at a reduced frame rate to reduce the power consumption of the display device.

The above-described SLC (Simple Logic Circuit) requires an initial signal that turns on or off the T3r. FIG. 5A illustrates a configuration of a shift register 140 in which the number of initial signal for controlling the T3r can be reduced. FIG. 5B illustrates a circuit structure of the first stage ST1 in the shift register of FIG. 5A.

Referring to FIG. 5A, a first start signal line VST1 for supplying a start signal to the uppermost stage in a driving area is used as the initial signal line. The first start signal line VST1 supplies the initial signal for operating the T3r to the stages in the driving area except for the uppermost stage and the stage immediately after the uppermost stage (i.e., ST1, ST3). In this case, T3r may be omitted from the first two stages (e.g., ST1 and ST3) in each of the stage groups as shown in FIG. 5B. That is, the first two stages in each driving area may be configured without the T3r as illustrated in FIG. 5B. The other stages ST5 to ST11 of the stage group still include T3r as illustrate in FIG. 4, and the gate of T3r is connected to the first start signal line VST1 to clear out any noise on the Q-node during initial power on of the display device.

In the above-described example, to drive the display area 110A as being divided, start signal lines VST1 and VST2 for applying two start signals to the first two stages in each driving area are needed. Since the scan driver for driving the display device in an interlaced manner needs two start signal lines in each side, each driving area needs total of four start signal lines. That is, in an interlaced driving scan driver, whenever the number of driving areas is increased by one, four start signal lines may be further added to the display device. However, the space for the additional start signal lines may be limited in the display device. Further, the increase in start signal lines may be limited by processing power of the timing controller TCON or the other circuits for driving the display device. In order to divide the display area 110A with additional number of driving areas without having to increase the number of start signal lines, one or more dummy stages may be added to each of the stage groups corresponding to the respective driving areas.

FIG. 6 is a diagram illustrating an exemplary configuration of a shift register provided with dummy stages for reducing the number of start signal lines according to an embodiment of the present disclosure.

Referring to FIG. 6, in each stage group of the respective driving area, the two uppermost stages configured to receive the start signals from the external start signal line are configured as dummy stages, which do not output scan signals on the scan lines of the respective driving area. In this case, the first dummy stage ST[D1], which is the uppermost stage in the stage group for each driving area, is configured to charge the Q-node and to clear noise on the Q-node by using one start signal applied from one start signal line. In the embodiments described in reference to FIGS. 3 and 5A, the uppermost stage of a stage group is operated in response to the start signals supplied from the first start signal line VST1 and the second signal line VST2. However, in the embodiment of FIG. 6, the uppermost stage of the stage group, the first dummy stage ST[D1], is configured to charge the Q-node and to remove noise of the Q-node in response to the start signal from a single start signal line VST1. The second dummy stage ST[D2] is configured to charge the Q-node by using the start signal from the first start signal line VST1 but remove noise of the Q-node by using the signal output from the output terminal of the first dummy stage ST[D1].

In each driving area, the stages except the dummy stages (i.e., ST[D1] and ST[D2]) are configured as illustrated in the circuit diagram of FIG. 4. That is, except the dummy stages in each stage groups of the driving area, the stages configured to output a scan signal include T3r. The first stage configured to output a scan signal on a scan line removes noise on the Q-node by using the signal output from the output terminal of the second dummy stage. Further, the first stage ST1 charges the Q-node by using the output signal of the first dummy stage. The initial signal for controlling T3r in each of the stages (except the dummy stages) is not provided via the first start signal line VST1, but instead it is provided via another signal line, such as RST3.

With the two uppermost stages in each of the stage groups are configured as dummy stages, each addition of a driving area in the display area 110A will increase the total number of stages in the shift register 140. However, with the two dummy stages, each stage group can be driven with a single start signal line VST. Accordingly, the use of the dummy stages reduces the number of start signal lines VST additionally required in increasing the number of driving areas in the display area 110A. For example, in the exemplary embodiments described with reference to FIG. 3 and FIG. 5, each stage group corresponding to a driving area uses two start signal lines VST1 and VST2, making total of eight start signal lines to divide the display area 110A into four driving areas. As mentioned, the total number of signal lines in the display device doubles if interlaced driving scheme is used. In the embodiment illustrated in FIG. 6, however, each stage group corresponding to a driving area uses a single start signal line. As such, four start signal lines are needed to divide the display area 110A into four driving areas. Even using the interlaced driving scheme, total of eight start signal lines are needed to independently control four stage groups corresponding to four driving areas, respectively. Reducing the number of start signal lines makes it possible to reduce the bezel size of the display device and simplify the inspection process during manufacturing of the display device.

Configuring the first two stages in each stage group as the dummy stages may provide improved stability and lifetime of the shift register. As mentioned above, T3r may be omitted from the first two stages of the stage group in the embodiments that use two start signal lines for each of the stage groups, described in reference to FIGS. 3 and 5A. In these embodiments, the first two stages have a different circuit structure from the remaining stages of the stage group, but all of the stages, including the first two stages, are operated to output a scan signal on the scan signal line. In this setting, the transistors implementing the first two stages of the stage group may deteriorate at a different pace from the transistors implementing the remainder of stages in the same stage group. Such difference in the deterioration rate between the transistors of the stages may be visually noticeable as all of the stages are connected to the scan lines for controlling the sub pixels of the display device.

On the other hand, in the embodiment using the dummy stages, those stages, which actually output a scan signal on the scan line, are designed to have the same circuit structure. The stages that have different circuit structure are the dummy stages, which are not connected to the scan lines. For instance, the dummy stages of each of the stage groups may be configured as shown in FIG. 5B while all the stages connected to the scan line are configured as depicted in FIG. 4. In this case, at least all of the stages connected to the scan line can be put under a similar stress condition during the operation of the display device, which may normalize the deterioration rate between the transistors implementing those stages. Accordingly, it is possible to reduce a scan signal output deviation caused by a difference in deterioration rates between the stages. This can help in suppressing the visually noticeable defects such as a line dimming between the driving areas.

Although exemplary embodiments of the present disclosure have been described with reference to the accompanying drawings, it would be understood by those skilled in the art that the above-described technical configuration of the present disclosure can be embodied in various manners without changing technical concept and essential features of the present disclosure. Thus, it is clear that the above-described embodiments are illustrative in all aspects and do not limit the present disclosure. Further, the scope of the present disclosure is defined by the following claims rather than by the detailed description of the embodiment. It shall be understood that all modifications and embodiments conceived from the meaning and scope of the claims and their equivalents are included in the scope of the present disclosure.

The invention claimed is:

1. A display device comprising:
a display panel including a display area divided into a plurality of driving areas;
a level shifter configured to output a plurality of start signals; and
a shift register including a plurality of stage groups, each of the stage groups corresponding to one of the driving areas, wherein each of the stage group includes at least one stage configured to receive a start signal from at least one external start signal line,
wherein first two stages of each of the stage groups are configured to receive the start signal from at least one external start signal line dedicated for the respective stage group, and
wherein, in each of the stage groups, each of the stages excluding first two stages of the respective stage group include a transistor configured to clear noise on a Q-node of the stage by discharging the Q-node of the stage to a low potential voltage upon receiving an initial signal.

2. The display device according to claim 1, wherein a first stage of each of the stage groups is configured to receive at least two start signals applied via at least two start signal lines dedicated for the respective stage group.

3. The display device according to claim 1, wherein the initial signal is applied via said at least two start signal lines.

4. The display device according to claim 3, wherein the initial signal is not applied to the first two stages in each of the stage groups.

5. The display device according to claim 1, wherein the first two stages in each of the stage groups are dummy stages which do not output a scan signal.

6. The display device according to claim 5, wherein the first two stages of each of the stage groups are configured to receive the start signal from one external start signal line dedicated for the respective stage group.

7. The display device according to claim 6, wherein, in each of the stage groups, the dummy stages of the stage group have a different circuit configuration from the remainder of the stages in the same stage group.

8. The display device according to claim 6, wherein, in each of the stage groups, stages excluding the dummy stages are configured to have the same circuit structure as each other.

9. The display device according to claim 6, wherein, in each of the stage groups, each of the stages excluding the dummy stages of the respective stage group include a transistor configured to clear noise on a Q-node of the stage by discharging the Q-node of the stage to a low potential voltage upon receiving an initial signal.

10. A method of operating a display device, comprising:
driving a set of stages of a first stage group corresponding to a first driving area of a display panel by supplying a start signal via an external start signal line connected to a first stage of the first stage group;
supplying a reset signal to a lowermost stage of the first stage group; and
driving a set of stages of a second stage group corresponding to a second driving area of the display panel by supplying a start signal via an external start signal line independently connected to a first stage of the second stage group,
wherein first two stages of each of the stage groups are configured to receive the start signal from at least one external start signal line dedicated for the respective stage group, and
wherein, in each of the stage groups, each of the stages excluding first two stages of the respective stage group include a transistor configured to clear noise on a Q-node of the stage by discharging the Q-node of the stage to a low potential voltage upon receiving an initial signal.

11. The method of claim 10, further comprising performing a touch scan operation prior to driving the set of stages of the second stage group corresponding to the second driving area of the display panel.

* * * * *